United States Patent
Fleurial et al.

(10) Patent No.: US 7,098,393 B2
(45) Date of Patent: Aug. 29, 2006

(54) THERMOELECTRIC DEVICE WITH MULTIPLE, NANOMETER SCALE, ELEMENTS

(75) Inventors: Jean-Pierre Fleurial, Altadena, CA (US); Margaret A. Ryan, Pasadena, CA (US); Alexander Borshchevsky, Santa Monica, CA (US); Jennifer Herman, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 198 days.

(21) Appl. No.: 10/150,772

(22) Filed: May 17, 2002

(65) Prior Publication Data
US 2003/0047204 A1 Mar. 13, 2003

Related U.S. Application Data

(60) Provisional application No. 60/292,052, filed on May 18, 2001.

(51) Int. Cl.
*H01L 35/16* (2006.01)
*H01L 35/18* (2006.01)
*H01L 35/14* (2006.01)

(52) U.S. Cl. .............. 136/240; 136/201; 136/205; 136/212; 136/236.1; 257/467

(58) Field of Classification Search ........... 136/201, 136/205, 212, 240, 236.1; 438/54; 257/467
See application file for complete search history.

(56) References Cited

U.S. PATENT DOCUMENTS

| | | | | |
|---|---|---|---|---|
| 6,002,081 | A * | 12/1999 | Sakuragi | 136/203 |
| 6,159,831 | A * | 12/2000 | Thrush et al. | 438/582 |
| 6,231,744 | B1 * | 5/2001 | Ying et al. | 205/324 |
| 6,359,288 | B1 * | 3/2002 | Ying et al. | 257/14 |
| 6,388,185 | B1 * | 5/2002 | Fleurial et al. | 136/205 |
| 6,492,585 | B1 * | 12/2002 | Zamboni et al. | 136/201 |
| 6,598,403 | B1 * | 7/2003 | Ghoshal | 62/3.2 |
| 6,670,539 | B1 * | 12/2003 | Heremans et al. | 136/240 |
| 2002/0158342 | A1 * | 10/2002 | Tuominen et al. | 257/784 |
| 2002/0172820 | A1 * | 11/2002 | Majumdar et al. | 428/357 |
| 2003/0041892 | A1 * | 3/2003 | Fleurial et al. | 136/227 |

FOREIGN PATENT DOCUMENTS

WO WO-03/046265 A2 * 6/2003

OTHER PUBLICATIONS

Huber et al, "Thermoelectric Properties of Bi and Bi2Te3 Composities," 16th International Conference of Thermoelectrics, (1997), pp. 404-408.*
Cronin et al, "Thermoelectric Investigation of Bismuth Nanowires," 18th International Conference on Thermoelectrics, (1999), pp. 554-557.*
U.S. Appl. No. 60/275,984, filed on Mar. 14, 2001.*
Peng et al, "Bismuth quantum-wires arrays fabricated by electrodeposition in nanoporous anodic aluminum oxide and its structural properties," Materials Science and Engineering B77 (2000), pp. 246-249, avalable online Oct. 27, 2000.*

(Continued)

*Primary Examiner*—Alan Diamond
(74) *Attorney, Agent, or Firm*—Fish & Richardson P.C.

(57) ABSTRACT

A thermoelectric device formed of nanowires on the nm scale. The nanowires are preferably of a size that causes quantum confinement effects within the wires. The wires are connected together into a bundle to increase the power density.

21 Claims, 3 Drawing Sheets

OTHER PUBLICATIONS

Lin et al, "Fabrication and Transport Properties of Te-Doped Bi Nanowire Arrays," MS Symposium H, Molecular Electronics as held at the 199 MRS Fall Meeting, Boston, Nov. 29 to Dec. 2, 1999.*

Ryan et al, "Electrochemically deposited semiconductor nanowires," The Electrochemical Society, Mar. 23, 2006.*

Dresselhaus et al., "Advances in 1D and 2D Thermoelectric Materials," The 18th International Conference on Thermoelectrics: ICT Symposium Proceedings, IEEE, pp. 92-99 (1999).

Dresselhaus et al., "Low Dimensional Thermoelectrics," The 16th International Conference on Thermoelectris: ICT Symposium Proceedings, IEEE, pp. 12-20 (1997).

Fleurial et al., "Thick-Film Thermoelectric Microdevices," The 18th International Conference on Thermoelectrics: ICT Symposium Proceedings, IEEE, pp. 294-300 (1999).

Hicks and Dresselhaus, "Thermoelectric figure of merit of a one-dimeinsional conductor," Physical Review B, vol.47, pp. 16631-16634 (1993).

Rabin et al., "Anomalously high thermoelectric figure of merit in $Bi_{1-x}Sb_x$ nanowires by carrier pocket alignment," Applied Physics Letters, vol. 73(20), pp. 2950-2952 (1998).

* cited by examiner

THERMOELECTRIC DEVICE WITH MULTIPLE, NANOMETER SCALE, ELEMENTS

CROSS-REFERENCE TO RELATED APPLICATIONS

This application claims benefit of U.S. Provisional Application No. 60/292,052, filed May 18, 2001.

STATEMENT AS TO FEDERALLY-SPONSORED RESEARCH

The invention described herein was made in the performance of work under a NASA 7-1407 contract, and is subject to the provisions of Public Law 96-517 (U.S.C. 202) in which the contractor has elected to retain title.

BACKGROUND

Thermoelectric devices may operate to create energy based on a temperature difference, or conversely, create a temperature difference based on applied energy. Thermoelectric devices may be used in harsh environments to create electrical power.

Miniaturized solid-state devices may be of interest for various miniaturized applications.

SUMMARY

The present invention recognizes that smaller thermoelectric devices may be used to create increased conversion efficiency. A number of individual "nano wires" are formed. These wires may be connected in bundles to create a composite positive device formed of many individual small elements.

BRIEF DESCRIPTION OF THE DRAWINGS

These and other aspects will now be described in detail with reference to the accompanying drawings, wherein.

DETAILED DESCRIPTION

Figure 2:
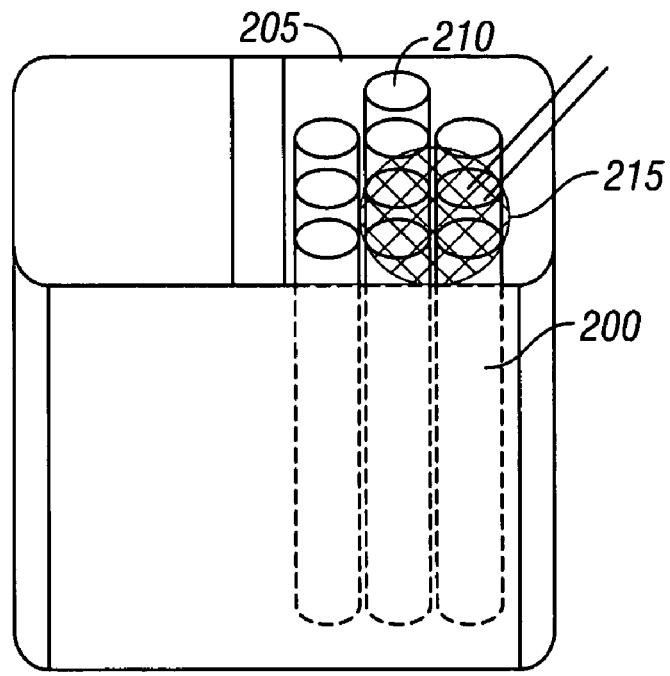
FIG. 2 shows a representative device with thermoelectric wires.

An embodiment is shown in FIG. 2. In the embodiment, a plurality of thermoelectric legs 200 are formed. Each of the thermoelectric legs is in the form a thin nanometer scale wire, that is a leg having an outer diameter or outer extent which is of the scale of nanometers: less than one micron in maximum outer extent. More preferably, the outer extent of the wire is less than 500 nm in outer extent, and even more preferably is 100 nm or less.

The thermoelectric elements are formed within a "template" 205, which is a device made of a specified material formed with a number of holes 210 therein. Any porous material with consistent size pores can be used as the template. The holes forming the pores extend through the device. The pores are filled with thermoelectric material, which become the legs of the thermoelectric device. A connection to the legs is made.

A state-of-the-art thermoelectric material may form such a miniaturized thermoelectric power source based on a $Bi_2Te_3$ alloy, although other thermoelectric materials can be used.

Figure 1A:
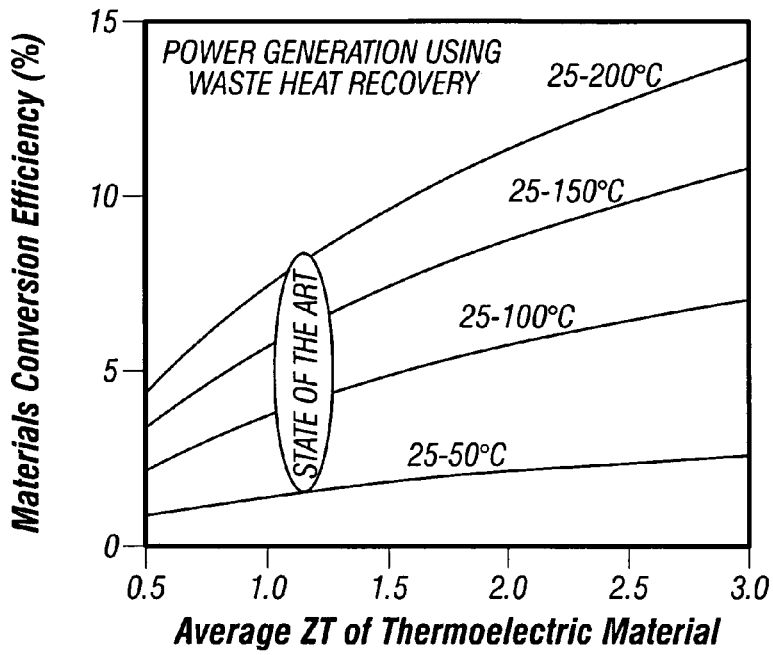
FIGS. 1A and 1B show representative curves for a thermoelectric material.
Figure 1B:
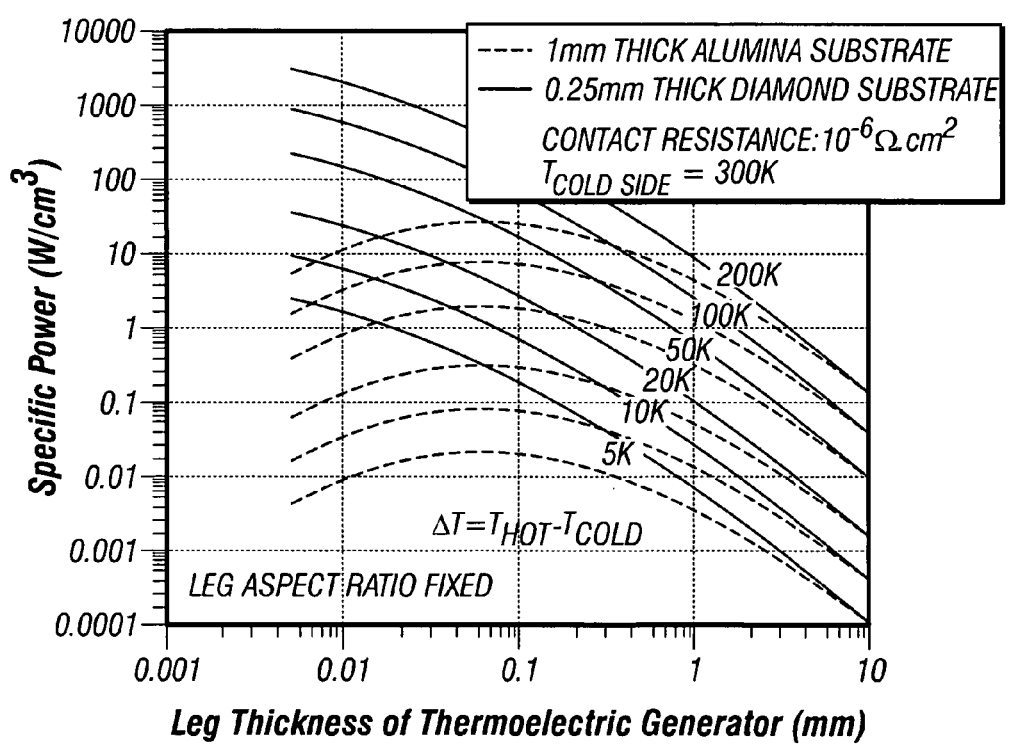

FIG. 1A shows a representative material conversion efficiency for an application of power generation using waste heat recovery using such devices, as a function of the figure of merit, ZT, of the material. For temperature differentials in the range of 20 to 200 degrees Kelvin, the graph of FIG. 1a shows that conversion efficiency between 1 and 15 percent may be possible. FIG. 1B shows the specific power obtained in watts/cm$^3$. It may be possible, as shown, to obtain in excess of 1000 watts/cm$^3$, depending on the temperature differential and other factors. FIG. 1B specifically illustrates that a greater power per cc is obtained when the leg thickness of the thermoelectric generator becomes smaller. This has lead to the conclusion that smaller legs may be desirable. However, current manufacturing techniques have often been limited. For example, bulk devices may be limited to 100 thermoelectric devices per square cm. Devices using micro techniques may be limited to 100,000 devices per square cm. The present system may have 10 times this, at least one million elements per square cm, and as many as one billion elements per square cm.

The present application teaches formation of vertically integrated thermoelectric microdevices that use a combination of thick film electrochemical deposition and integrated circuit processing techniques. In the embodiment, the legs are produced that are no thicker than 50 to 100 microns. Even for small temperature differences such as 10–20 degrees K., specific power outputs in the 1–10 watts/cm$^3$ range become achievable.

The present system may operate using templates of porous alumina. Such templates are commercially available, or can be formed using semiconductor techniques. Templates which have holes on the order of 100 nm by 60 um can be commercially purchased.

One aspect of the present system recognizes that the efficiency of the thermoelectric device is increased by decreasing the leg diameter to a size at which quantum confinement effects will occur. A preferred system, therefore, increases the performance efficiency by enhancing the charge carrier mobility using Quantum confinement effects. The thermoelectric devices may be for example of molecular scale in diameter, for example on the order of magnitude of 10 nm diameter (more specifically, anything less than around 100 nm). In addition, these elements may have a high aspect ratio. For example, it may be desirable for the height of the nanowire to be three orders of magnitude greater than the diameter of the nanowire. One example is a nanowire of the order of 10 nm in diameter by 20 to 50 um tall. This may maintain a large ΔV at low heat fluxes, thus further increasing the generator capability.

It may be difficult to contact individual wires of this size. Accordingly, in this embodiment, the wires are contacted in bundles 215 as shown in FIG. 2. The bundles can be, for example, a bundle of multiple wires collectively measuring approximately 10 microns. Each bundle may have a fill factor of approximately 50 percent, representing the ratio between opening areas that have been filled with thermoelectric material, and closed areas representing areas of the template.

The formation of the device can be made by filling the pores with thermoelectric material, for example using a growth technique. Each pore may be over filled, which hence overgrows the material onto the top of the template. This is then followed by polishing the template back to a level of fill.

After this polishing, the wire bundles are contacted by electrochemically depositing a metallic material such as nickel, on top of the wires. This electrochemically grown metal cap on each wire allows the metal to spread and contact adjacent metal caps.

As noted above, the templates may be porous templates formed of alumina, having pores of 100 nm or in another embodiment, pores of 40 nm.

Figure 3:
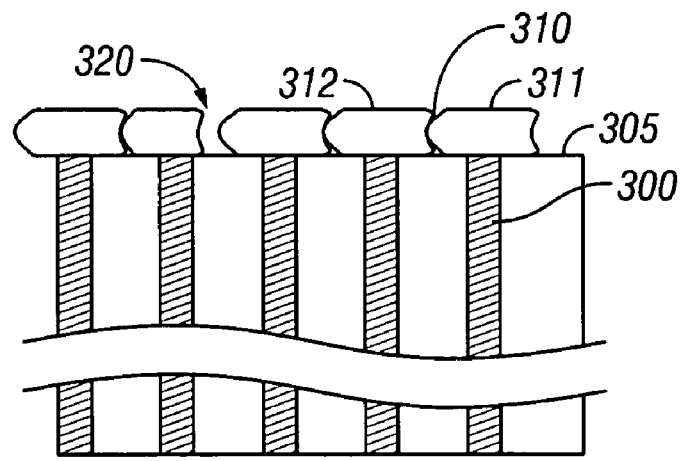
FIG. 3 shows the way in which the thermoelectric wires can be interconnected.

FIG. 3 shows an embodiment, with $Bi_2Te_3$ nanowires 300 of 100 nm by 40 microns long, although the figure is not shown to scale. The thermoelectric material overgrows the top portion 305 of the template, forming caps which contact one another, such as at the contact area 310 between the caps 311 and 312. These wires may have a measured Seebeck coefficient of $-125$ uV/K. The caps contacting one another may form the connections of the bundles. A separation area 320 separates between between adjacent bundles.

The inventors found that even though several wires are contacted in parallel to form a group, the Quantum effects are not effected by this contact and each wire remains isolated from the other wires except at the area of the contact. The alumina template is left in place.

Figure 4:
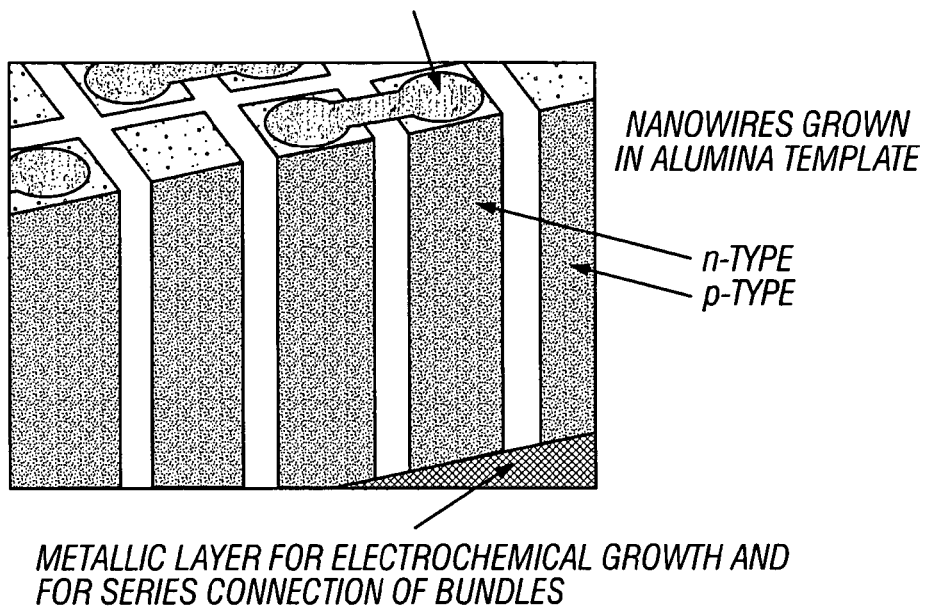
FIG. 4 shows another embodiment in which connections are carried out both on the top and bottom portions.

FIG. 4 shows how multiple wires can be grown in groups by masking the template and patterning the bottom contact. The electrochemical growth begins at the bottom, and then the groups of wires are contacted with an electrochemically grown metal cap. FIG. 4 shows n type and p type nanowires being grown within the template. Wires within a group are contacted in parallel. The groups are contacted in series to make a thermoelectric device in the same way that thermoelectric Microdevices are fabricated. The bottom metallic layer is used for the electrochemical growth and for the series connection of the bundles.

The above has described forming the thermoelectric material within templates. However, other techniques may include photoresist masking and microfabrication.

Figure 5:
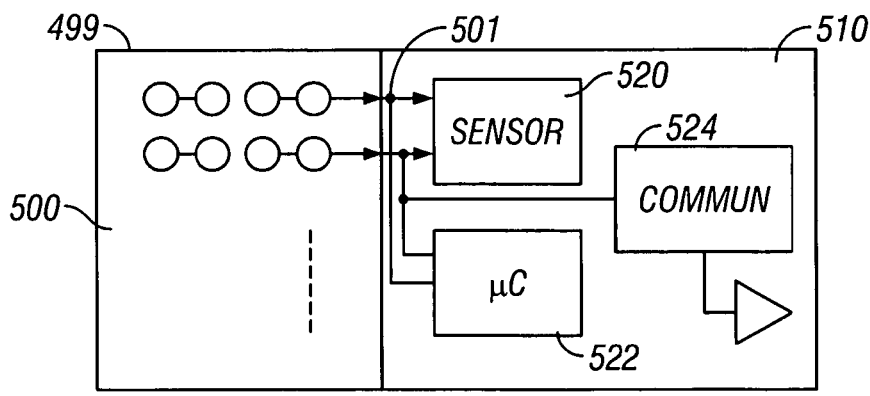
FIG. 5 shows other circuitry being formed on the same substrate as the thermoelectric device.

Another embodiment is shown in FIG. 5. In this embodiment, semiconductor techniques are used to form a chip 499 which includes both a thermoelectric device 500, and other operative structures 510 on the chip. For example, the FIG. 5 device shows a whole system on a chip, including the functions of sense, compute, actuate, control, communicate and power on the single chip. The system shows power output lines 501 from the thermoelectric device which are used to drive a sensor part 520, a microcomputer or microprocessor part 522, and a communication part 524. All of this is formed on the same semiconductor substrate.

In addition, this system may be used for any thermoelectric application, including but not limited to a micro cooler, or a microchip or generator based on thermoelectric conversion. The device can be used in sensors, detectors, microprobes and micro Rovers. This may also be used in consumer electronics, automotive applications, wearable and flexible power generating device structures as well as biological and medicinal applications.

Although only a few embodiments have been disclosed in detail above, other modifications are possible. For example, the above has described nanoscale wires which are effectively one-dimensional devices. Nanoscale layers, effectively two-dimensional devices, are also contemplated. Also, and zero dimensional devices, effectively Quantum dots, are contemplated.

What is claimed is:

1. A thermoelectric device, comprising:
a porous semiconductor having pores therein;
a plurality of discrete thermoelectric nanowires formed in said pores of said porous semiconductor, each of the nanowires formed of a Bi/Te alloy, and each having an outer extent of a size at which thermoelectrically significant quantum confinement effects occur, said plurality of thermoelectric nanowires connected to one another to form an operative thermoelectric device.

2. A thermoelectric device as in claim 1, wherein said Bi/Te alloy is $Bi_2Te_3$.

3. A thermoelectric device as in claim 1, wherein said thermoelectric nanowires are three orders of magnitude taller than their outer extent.

4. A thermoelectric device as in claim 1, wherein said operative thermoelectric device has a specific power output greater than 1 watt per cc for a 10 to 20 degrees Kelvin temperature difference.

5. A thermoelectric device as in claim 1, further comprising a contact to said thermoelectric nanowires.

6. A thermoelectric device as in claim 5, wherein said contact is a contact to a bundle of multiple wires.

7. A thermoelectric device as in claim 6, wherein said bundle of multiple wires is a bundle of approximately 10 microns in diameter.

8. A thermoelectric device as in claim 1, wherein said porous semiconductor has a till factor for the Bi/Te alloy of approximately 50 percent.

9. A thermoelectric device as in claim 1, further comprising a connection between adjacent thermoelectric nanowires.

10. A thermoelectric device as in claim 9, wherein said connection includes an overgrown material cap on a top portion of said porous semiconductor which contacts between adjacent nanowires.

11. A thermoelectric device as in claim 9, wherein said connection includes a grown cap on one end, and a patterned portion on another end.

12. A thermoelectric device as in claim 1, further comprising additional circuitry within said semiconductor, powered by said thermoelectric device.

13. A thermoelectric device, comprising:
a porous substrate, having pores therein;
a plurality of thermoelectric nanowires, formed in said pores of said porous substrate, each having an outer extent of less than approximately 100 nm, connected to one another to form an operative thermoelectric device.

14. A device as in claim 13, wherein said thermoelectric material includes $Bi_2Te_3$.

15. A device as in claim 13, wherein said thermoelectric nanowires are three orders of magnitude taller than their outer extent.

16. A thermoelectric device as in claim 13, wherein said device has a specific power output greater than 1 watt per cc for a 10 to 20 degrees Kelvin temperature difference.

17. A thermoelectric device as in claim 13, wherein said nanowires have a diameter of a size at which quantum confinement effects will occur.

18. A thermoelectric device as in claim 13, wherein said porous substrate has an open space to closed space ratio of approximately 50 percent.

19. A thermoelectric device as in claim 13, further comprising additional circuitry formed in said porous semiconductor and powered by said thermoelectric device.

20. A thermoelectric apparatus, comprising:

a porous semiconductor having pores therein;

a plurality of thermoelectric devices that each include a collection of N type thermoelectric nanowires in parallel, the collection of N type nanowires being in series with a collection of P type thermoelectric nanowires in parallel, the thermoelectric nanowires formed of a thermoelectric material in the pores of the porous semiconductor and having an outer extent which is less than one micron in maximum outer diameter; and an overgrown material cap series connection between two devices in the plurality, the overgrown material cap series connection allowing said devices to operate in series.

21. The thermoelectric apparatus of claim 20, wherein the thermoelectric devices comprise a Bi/Te alloy.

* * * * *